United States Patent
Hung

(10) Patent No.: US 10,727,094 B2
(45) Date of Patent: Jul. 28, 2020

(54) THERMAL REFLECTOR DEVICE FOR SEMICONDUCTOR FABRICATION TOOL

(71) Applicant: Taiwan Semiconductor Manufacturing Co., Ltd., Hsin-Chu (TW)

(72) Inventor: Shih-Wei Hung, Kaohsiung (TW)

(73) Assignee: TAIWAN SEMICONDUCTOR MANUFACTURING CO., LTD, Hsin-Chu (TW)

(*) Notice: Subject to any disclaimer, the term of this patent is extended or adjusted under 35 U.S.C. 154(b) by 0 days.

(21) Appl. No.: 15/287,434

(22) Filed: Oct. 6, 2016

(65) Prior Publication Data

US 2017/0221735 A1 Aug. 3, 2017

Related U.S. Application Data

(60) Provisional application No. 62/288,663, filed on Jan. 29, 2016.

(51) Int. Cl.
| | |
|---|---|
| *H01L 21/67* | (2006.01) |
| *C23C 16/48* | (2006.01) |
| *G02B 5/00* | (2006.01) |
| *C23C 16/46* | (2006.01) |

(52) U.S. Cl.
CPC ........ *H01L 21/67115* (2013.01); *C23C 16/46* (2013.01); *C23C 16/481* (2013.01)

(58) Field of Classification Search
CPC .. C23C 16/46; C23C 16/481; C23C 16/45536
USPC .............. 118/715–733; 156/345.1–345.55
See application file for complete search history.

(56) References Cited

U.S. PATENT DOCUMENTS

| | | | | |
|---|---|---|---|---|
| 3,523,721 A | * | 8/1970 | Hofmann | G02B 3/08 359/743 |
| 3,902,794 A | * | 9/1975 | Abrams | G02B 3/08 359/853 |
| 4,030,890 A | * | 6/1977 | Diggs | B01J 7/02 422/186 |
| 4,832,777 A | * | 5/1989 | Davis | H01L 21/67115 118/725 |
| 4,975,561 A | * | 12/1990 | Robinson | C23C 16/481 219/390 |

(Continued)

FOREIGN PATENT DOCUMENTS

CN          103415910 A          11/2013

*Primary Examiner* — Charlee J. C. Bennett
(74) *Attorney, Agent, or Firm* — Haynes and Boone, LLP

(57) ABSTRACT

A system and apparatus for thermal treatment of a substrate with improved thermal uniformity is provided. In some embodiments, the system includes a heating element, a substrate-retaining element operable to retain a substrate, and a reflective structure operable to direct thermal energy of the heating element towards the substrate retained in the substrate-retaining element. The reflective structure includes a textured portion wherein a texture of the textured portion is configured to direct the thermal energy towards the retained substrate. In some such embodiments, the texture includes a roughened irregular surface configured to direct the thermal energy towards the retained substrate. In some such embodiments, the texture includes a plurality of circumferential ridge structures configured to direct the thermal energy towards the retained substrate.

15 Claims, 10 Drawing Sheets

(56) References Cited

U.S. PATENT DOCUMENTS

| | | | |
|---|---|---|---|
| 5,108,792 A * | 4/1992 | Anderson | C23C 16/44 118/715 |
| 5,399,523 A * | 3/1995 | Kakoschke | H01L 21/2686 257/E21.349 |
| 5,446,825 A * | 8/1995 | Moslehi | C23C 16/481 118/724 |
| 5,561,735 A * | 10/1996 | Camm | C23C 16/481 118/725 |
| 6,021,152 A * | 2/2000 | Olsen | C23C 14/12 372/99 |
| 6,108,491 A * | 8/2000 | Anderson | H01L 21/67115 118/725 |
| 6,150,006 A * | 11/2000 | Hellmann | C03C 15/00 428/141 |
| 6,316,747 B1 * | 11/2001 | Blersch | H01L 21/67115 118/50.1 |
| 6,437,290 B1 * | 8/2002 | Shao | C23C 16/481 118/724 |
| 7,667,271 B2 | 2/2010 | Yu et al. | |
| 7,910,453 B2 | 3/2011 | Xu et al. | |
| 8,138,451 B2 * | 3/2012 | Gat | F27B 5/04 118/50.1 |
| 8,377,779 B1 | 2/2013 | Wang | |
| 8,399,931 B2 | 3/2013 | Liaw et al. | |
| 8,652,894 B2 | 2/2014 | Lin et al. | |
| 8,685,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,815,380 B1 * | 8/2014 | Nemeth | C03C 21/002 216/101 |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,629,271 B1 * | 4/2017 | Lancaster-Larocque | B24C 1/06 |
| 2002/0104205 A1 * | 8/2002 | Goodwin | H01L 21/67115 29/25.01 |
| 2009/0194024 A1 * | 8/2009 | Burrows | C23C 16/452 118/712 |
| 2009/0252982 A1 * | 10/2009 | O'Keefe | F41H 1/02 428/573 |
| 2012/0138802 A1 * | 6/2012 | Orlach | G01J 5/061 250/352 |
| 2013/0094084 A1 * | 4/2013 | Merrill | G02B 5/285 359/485.03 |
| 2013/0270107 A1 * | 10/2013 | Ewert | C23C 14/541 204/298.09 |
| 2014/0001574 A1 | 1/2014 | Chen et al. | |
| 2014/0110755 A1 | 4/2014 | Colinge | |
| 2014/0151812 A1 | 6/2014 | Liaw | |

* cited by examiner

THERMAL REFLECTOR DEVICE FOR SEMICONDUCTOR FABRICATION TOOL

PRIORITY DATA

This application claims the benefit of U.S. Prov. App. No. 62/288,663 entitled "Thermal Reflector Device for Semiconductor Fabrication Tools," filed Jan. 29, 2016, herein incorporated by reference in its entirety.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs, and, for these advances to be realized, similar developments in device design are needed.

For example, epitaxy is one technique for depositing material used in the fabrication of integrated circuits that is ripe for improvement. Epitaxy may be used to grow semiconductor crystals as well as other crystalline structures. In a conventional vapor-phase epitaxial process, a target material is heated, and a semiconductor-containing gas is supplied. If the environment is properly maintained, the semiconductor precipitates out of the gas and on to the target in a controlled manner. In particular, the rate of precipitation/deposition depends on the surface temperature of the target material, as well as the supply rate of the gas or gasses and pressure within the epitaxial chamber. Epitaxy is capable of producing layers of highly uniform thickness; however minute deviations that may be perfectly acceptable in one technology may be critical defects once the design node shrinks. Accordingly, while conventional systems and techniques of epitaxial deposition have been adequate for previous designs, they may not be able to meet the needs of the next generation of integrated circuits. In order to continue to meet ever-increasing design requirements, further advances are needed in this area and others.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
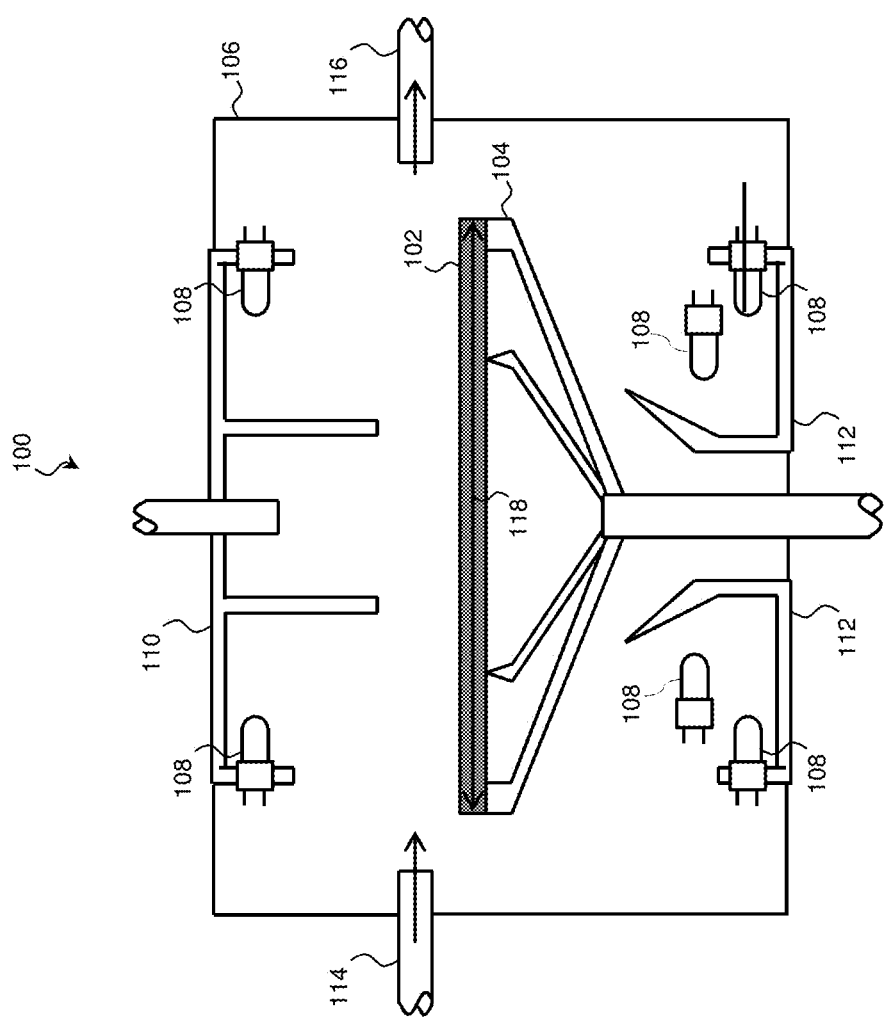
FIG. 1 is a schematic view of a fabrication system according to various aspects of the present disclosure.

The present disclosure relates generally to IC device manufacturing and, more particularly, to a system for thermal treatment of a substrate with improved thermal uniformity.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a schematic view of a fabrication system 100 according to various aspects of the present disclosure. The principles of the present disclosure apply equally across a wide array of fabrication tools, and the fabrication system 100 may be representative of an epitaxial tool, an annealing tool, and/or any other integrated circuit fabrication tool in which the temperature of a workpiece or substrate affects the quality of the results. FIG. 1 has been simplified for the sake of clarity and to better illustrate the concepts of the present disclosure.

In some embodiments, the fabrication system 100 is operable to perform an epitaxial process and thereby deposit a crystalline, polycrystalline, and/or amorphous material on a substrate 102. Suitable substrates 102 encompass any workpiece used in semiconductor fabrication. For example, the substrate 102 may include bulk silicon. In various examples, the substrate 102 may comprise an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. The substrate 102 may also have a silicon-on-insulator (SOI) structure and thus may include an insulator such as a semiconductor oxide, a semiconductor nitride, a semiconductor oxynitride, a semiconductor carbide, and/or other suitable insulator materials. SOI substrates are fabricated using separation by implantation of oxygen (SIMOX), wafer bonding, and/or other suitable methods. In some embodiments, the substrate 102 is a mask substrate and includes non-semiconductor materials such as quartz, LTEM glass, silicon carbide, silicon oxide, and/or titanium oxide.

The substrate 102 may be retained in a susceptor 104 within a central chamber 106 of the fabrication system 100 for processing. Atmospheric controls, including filtering, maintain an environment with extremely low levels of particulates and airborne molecular contamination ("AMC"), both of which may damage a substrate 102. By creating a microenvironment within the central chamber 106, the epitaxial process can be performed in a cleaner environment than the surrounding facilities. The sealed construction of the central chamber 106 may also help to maintain pressure or temperature and to contain process gases.

Within this central chamber 106, heating of the substrate 102 for epitaxy and/or other processes may be performed in part by one or more heating elements 108. Heating elements 108 may include infrared lamps, radiant heating tubes, burners, and/or any other suitable heating element. In some embodiments, the heating elements 108 may directed at the front surface (e.g., the surface undergoing epitaxial growth and the uppermost surface as shown in FIG. 1) of the substrate 102, the back surface of the substrate 102, or a combination thereof. The fabrication system may include reflectors, such as top reflector 110 and bottom reflector 112, to direct thermal energy towards the substrate 102. The reflectors may be particularly beneficial for heating elements 108 that are not directional.

In addition to or as an alternative to the heating elements 108, the central chamber 106 may include one or more induction heating coils disposed near to the substrate. In some embodiments, the heating coils are integrated into the susceptor 104 and transfer energy through the back surface of the substrate 102, although the induction heating coils may also be separate from the susceptor 104 and direct thermal energy to any surface of the substrate 102.

During an exemplary epitaxy process, the heating elements 108 heat the substrate 102 to a suitable temperature (about 650° C. in a low-temperature example and about 1200° C. in a high-temperature example). Once the substrate 102 is heated, various gases are provided on the substrate 102. In an example, a semiconductor-containing precursor gas (e.g., $SiH_4$, $Si_2H_6$, $SiHCl_3$, etc.) is provided from an inlet 114 across the front surface of the substrate 102. A second gas, a carrier gas, (e.g., $H_2$, $N_2$, etc.) is provided around the substrate 102. In some examples, the carrier gas is provided up through ports in the susceptor 104. The gasses react, and the semiconductor of the precursor gas is deposited on the front surface of the substrate 102 to form an orderly crystalline structure. The carrier gas may catalyze the reaction of the precursor gas and may carry the resultant products away from the substrate 102. Remaining gases and the resulting gaseous products are exhausted through an exhaust port 116.

Figure 2:
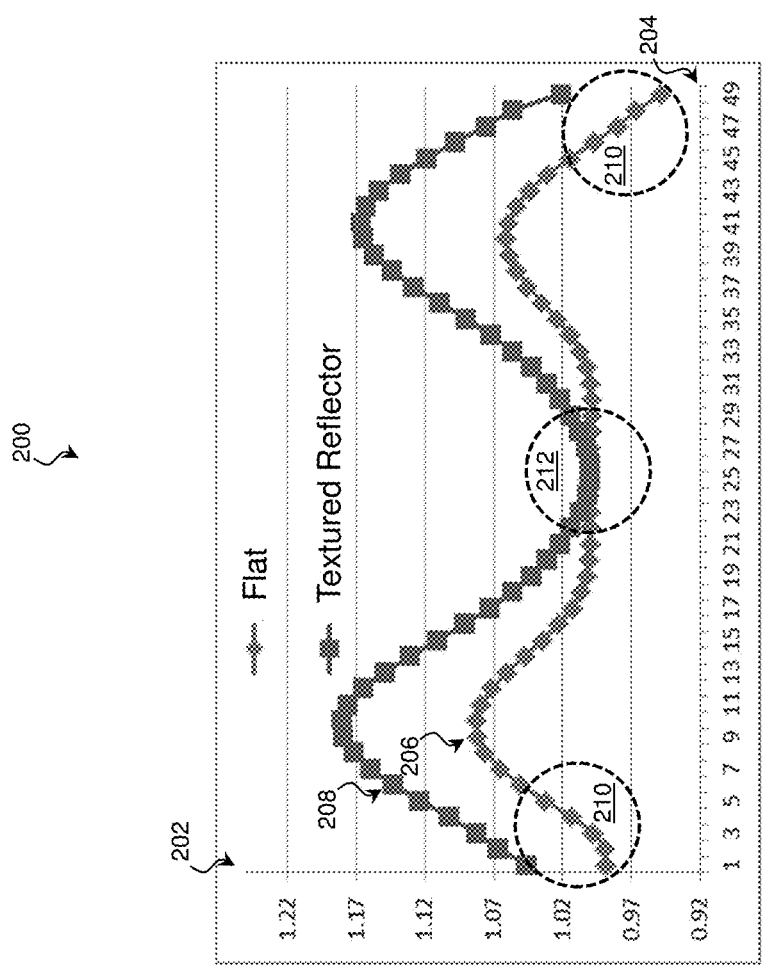
FIG. 2 is a plot of observed results of an epitaxial process according to various aspects of the present disclosure.

Referring to FIG. 2, it has been determined through experimentation that in many fabrication systems 100, the substrate 102 is heated unevenly despite a uniform distribution of heating elements 108. FIG. 2 is a plot 200 of observed results of an epitaxial process according to various aspects of the present disclosure. Axis 202 represents normalized thickness of an epitaxially-grown material formed on the substrate 102 measured at the front surface, and axis 204 indicates distance along a diameter of the substrate 102 (indicated by arrow 118 of FIG. 1) at which the thickness was measured.

Curve 206 represents heating using a first type of fabrication system 100 and shows that the growth rate upon the substrate 102 is not uniform. For example, the measured thickness in a circumferential region of the substrate 102 (indicated by markers 210) may be significantly less than the thickness at the center of the substrate 102 (indicated by marker 212). Furthermore, the thickness throughout the circumferential region may vary significantly (i.e., the thickness at the 3 o'clock position may vary from the thickness at the 9 o'clock position). In some applications, this is caused by temperature variability across the surface of the substrate 102 that causes process variations including the differences in thickness. These process variations may reduce yield in some parts of the substrate 102.

In contrast, curve 208 represents heating using a fabrication system 100 that includes improved reflectors described in more detail below. As is evident from the curve 208, the thickness of the epitaxial material on the circumferential region of the substrate 102 is closer to the thickness at the center of the substrate. This indicates that the temperature during the epitaxial process is more uniform between the center and circumferential region of the substrate 102. While temperature values at intermediate locations on the substrate 102 may be higher than those of curve 206, resulting in greater thickness of the epitaxial material, these higher temperatures may or may not affect yield depending on the process being performed. In some examples, excess epitaxial material is easily removed by chemical mechanical polishing/planarization (CMP). Even when epitaxial material is not so easily removed, temperatures at intermediate locations may be easier to control than temperatures along the edge of the wafer. Accordingly, the improved reflectors described with reference to FIGS. 3-12 have demonstrated significant reductions in temperature variability and significant improvements in yield.

Figure 3:
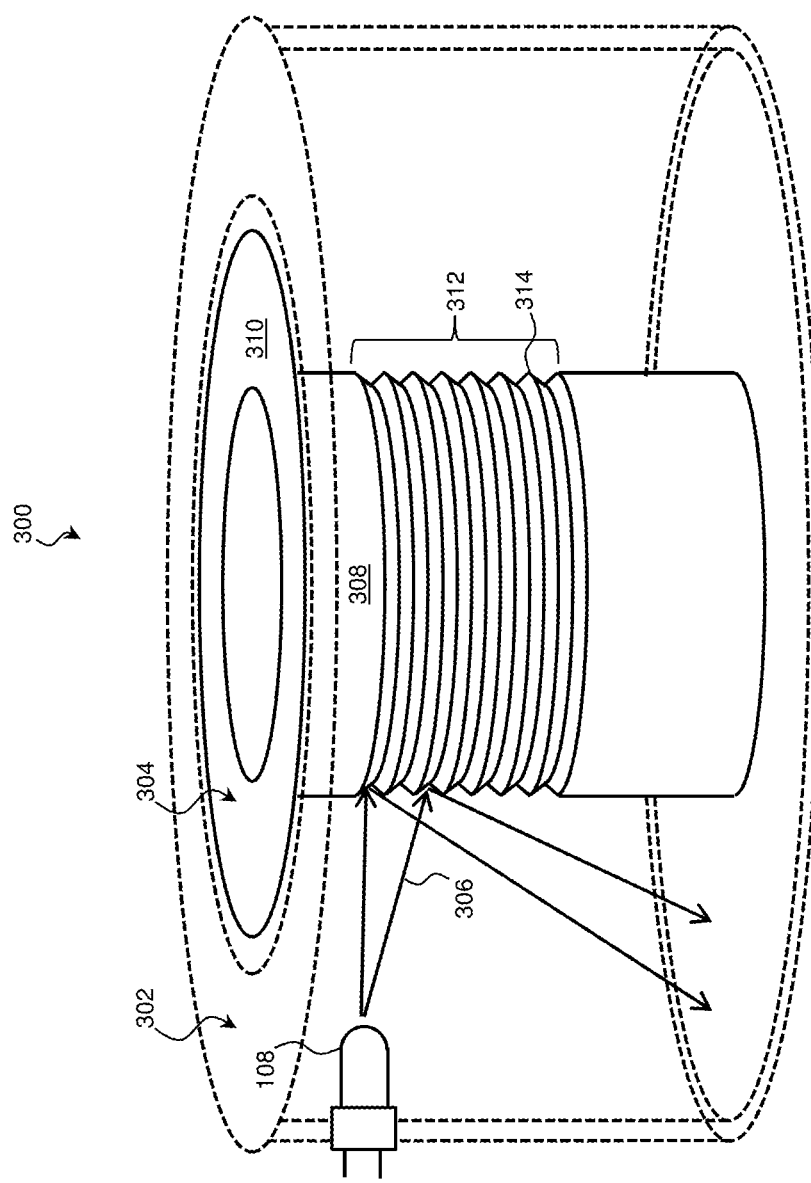
FIG. 3 is a perspective view of a top reflector according to some embodiments of the present disclosure.

FIG. 3 is a perspective view of a top reflector 300 according to some embodiments of the present disclosure. The top reflector 300 is suitable for use as the top reflector 110 of the fabrication system 100 of FIG. 1 and/or any other suitable fabrication tool. For clarity, an outer portion 302 of the reflector 300 is represented as transparent to better illustrate an inner portion 304. In some embodiments, the top reflector 300 is structured so that thermal energy from heating elements 108 is emitted between the outer portion 302 and the inner portion 304. In some such embodiments, the heating elements 108 extend through holes in the outer portion 302 so that a portion of each heating element 108 that produces the energy is disposed between the outer portion 302 and the inner portion 304. Exemplary rays 306 of thermal energy emitted by the heating elements are shown and represent radiant heat such as infrared or other thermal radiation and/or any other type of emitted energy.

The inner portion 304 of the top reflector 300 has a round body 308 extending from an upper flange 310. The round body 308 is designed with a shape and a surface pattern so that to reflect thermal energy from the heating elements 108 towards the substrate 102, in particular, towards the circumference of the substrate 102. In the present embodiment, the round body 308 is a substantially cylindrical body (still referred to as 308), which may be made of any suitable material such as silver, gold, and/or copper, is configured to reflect the thermal energy from the heating elements 108. Furthermore, in the illustrated embodiment, the inner portion 304 has a textured region 312 along the length of the substantially cylindrical body 308. The texture of the textured region 312 may be configured so that reflected thermal energy is directed towards the substrate 102 and, in particular, towards the circumference of the substrate 102. Compared to a conventional design, the top reflector 300 with the textured region 312 may reflect more thermal energy towards the edge of the substrate 102 and may produce more uniform substrate heating. In these ways and others, the top reflector 300 having the textured region 312 provides greater control over where the reflected energy falls on the substrate 102 than a conventional top reflector.

To achieve this, the textured region 312 may include one or more circumferential ridges 314 aligned with the circumference of the cylindrical body 308 that extend any suitable depth into and/or out of the outermost surface of the inner portion 304. The circumferential ridges 314 are enlarged to provide clarity, and in various exemplary embodiments, the ridges 314 have a peak-to-trough height of between about 0.1 mm to about 2 mm. The particular height may be selected to control where the reflected thermal energy is received on the substrate 102. The amount of reflected thermal energy and where it falls on the substrate 102 may also be controlled by the amount of the substantially cylindrical body 308 that is textured to produce the textured region 312 and where the textured region 312 is located along the cylindrical body 308. For example, in some embodiments, the body 308 includes an untextured portion between the upper flange 310 and the textured region 312. In other embodiments, the textured region 312 extends completely to the upper flange 310.

The circumferential ridges 314 may be formed by any suitable process or processes. In some examples, the ridges 314 are formed by mechanical means such as cutting or forming (e.g., bending, tucking, stretching, etc.), which may be followed by polishing. In some examples, the ridges 314 are formed by chemical means such as chemical etching, which may be performed as part of a polishing process. In further examples, the ridges 314 are formed by a combination of both mechanical and chemical means.

Figure 4:
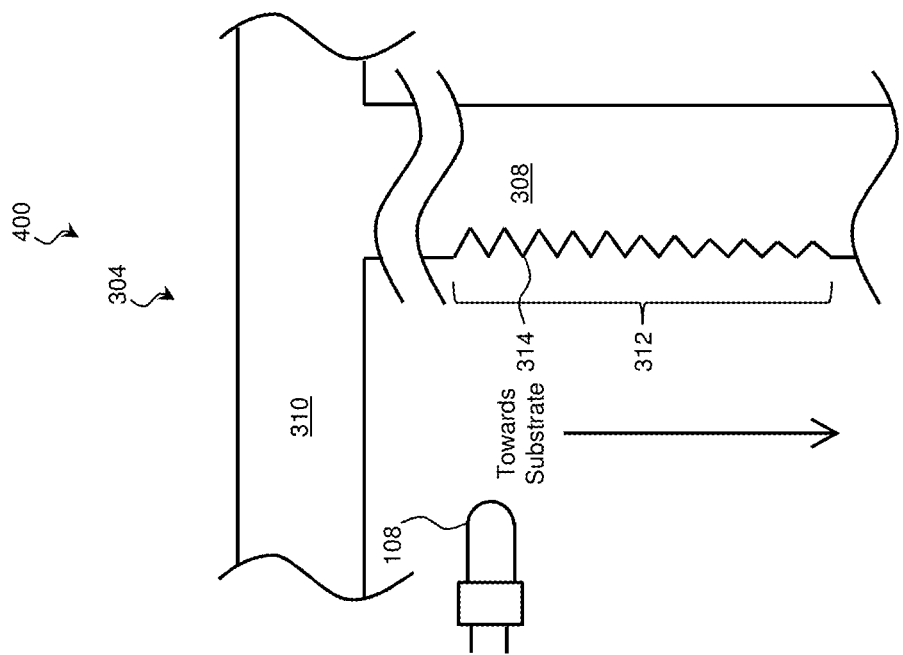
FIG. 4 is a cross-sectional view of a portion of a top reflector having circumferential ridges of varying height according to some embodiments of the present disclosure.

While the circumferential ridges 314 in the embodiments of FIG. 3 are uniform in peak-to-trough height and trough-to-trough width, in other embodiments, the ridges 314 vary along the textured region 312. By varying the ridge 314 shape, the angle of the surfaces of the ridge 314 can be tuned in order to control where energy reflected by the ridge 314 falls on the substrate 102. For example, FIG. 4 is a cross-sectional view of a portion of a top reflector 400 having circumferential ridges 314 of varying height according to some embodiments of the present disclosure. The top reflector 400 may be substantially similar to the top reflector 300 of FIG. 3 and is suitable for use as the top reflector 110 of the fabrication system 100 of FIG. 1 and/or any other suitable fabrication tool. An outer portion of the reflector 400 is omitted to better illustrate an inner portion 304 but may be substantially similar to the outer portion 302 of FIG. 3.

As can be seen, the peak-to-trough height of the ridges 314 varies along the textured region 312. In the illustrated embodiment, ridges 314 near the top of the top reflector 400 have a greater peak-to-trough height than ridges 314 near the bottom of the top reflector 400, although this is merely exemplary and in further embodiments, the opposite is true (i.e., ridges 314 near the bottom of the top reflector 400 have a greater peak-to-trough height than ridges 314 near the top of the top reflector 400).

Figure 5:
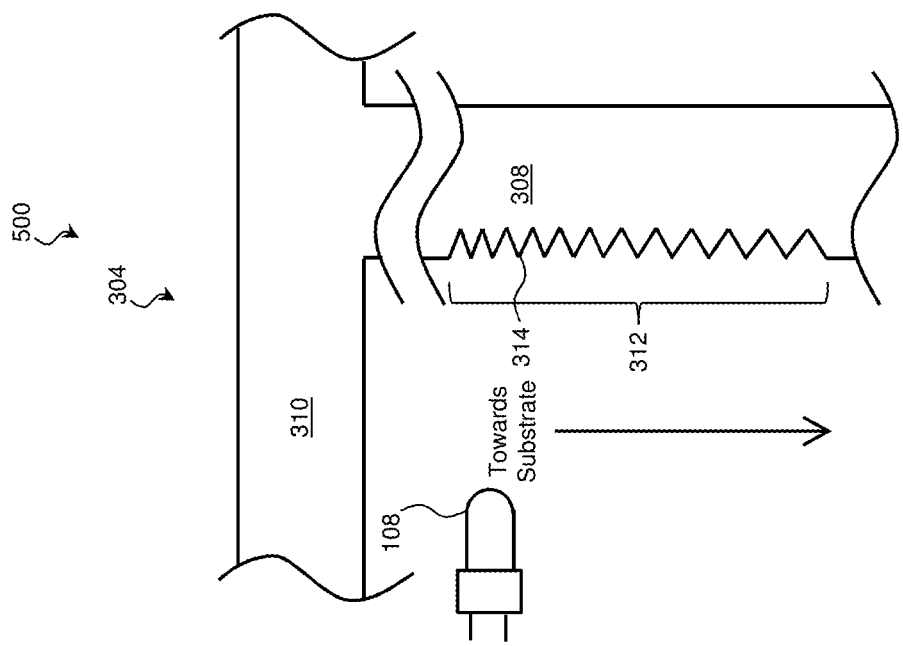
FIG. 5 is a cross-sectional view of a portion of a top reflector having circumferential ridges of varying width according to some embodiments of the present disclosure.

FIG. 5 is a cross-sectional view of a portion of a top reflector 500 having circumferential ridges 314 of varying width according to some embodiments of the present disclosure. The top reflector 500 may be substantially similar to the top reflectors 300 and 400 of FIGS. 3 and 4, respectively, and is suitable for use as the top reflector 110 of the fabrication system 100 of FIG. 1 and/or any other suitable fabrication tool. An outer portion of the reflector 400 is omitted to better illustrate an inner portion 304 but may be substantially similar to the outer portion 302 of FIG. 3.

As can be seen, the trough-to-trough width of the ridges 314 varies along the textured region 312. In the illustrated embodiment, ridges 314 near the top of the top reflector 500 have a narrower width than ridges 314 near the bottom of the top reflector 500, although this is merely exemplary, and in further embodiments, the opposite is true (i.e., ridges 314 near the bottom of the top reflector 500 have a narrower width than ridges 314 near the top of the top reflector 500).

Of course, it is understood that features may be combined from any of the exemplary top reflectors 300, 400, and 500, and no particular feature is required for any particular embodiment.

Figure 6:
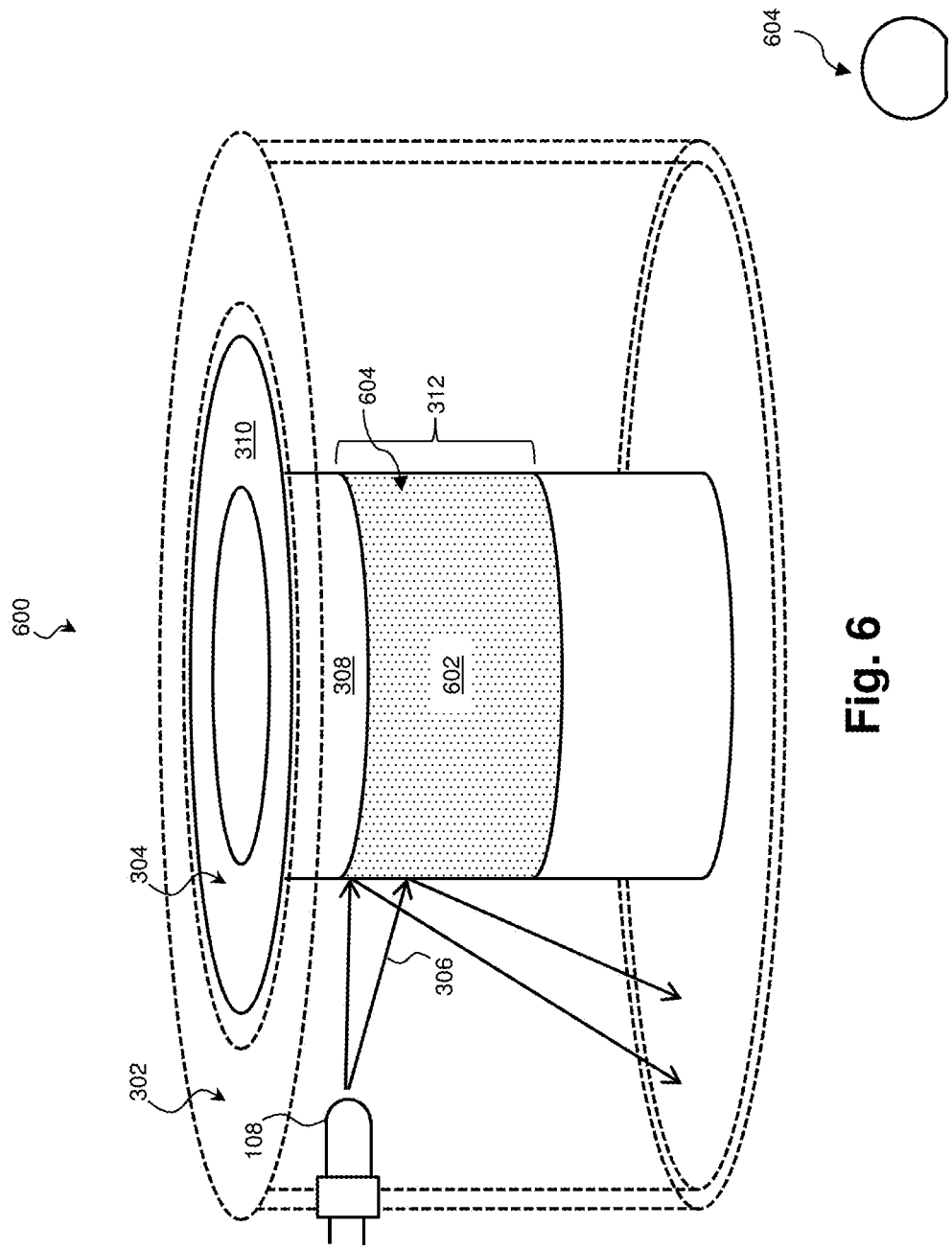
FIG. 6 is a perspective view of a top reflector according to some embodiments of the present disclosure.

In the embodiments of FIGS. 3-5, the textured region 312 includes a series of circumferential ridges 314 that wrap around substantially cylindrical body 308. Additionally or alternatively, some or all of the textured region 312 may have a roughened texture configured to control reflected thermal energy. FIG. 6 is a perspective view of a top reflector 600 according to some embodiments of the present disclosure. The top reflector 600 is suitable for use as the top reflector 110 of the fabrication system 100 of FIG. 1 and/or any other suitable fabrication tool. For clarity, an outer portion 302 of the reflector 600 is represented as transparent to better illustrate an inner portion 304. The outer portion 302 may be substantially similar to that described in FIG. 3 and may be structured so that thermal energy from heating elements 108 is emitted between the outer portion 302 and the inner portion 304. In some such embodiments, the heating elements 108 extend through holes in the outer portion 302 so that a portion of each heating element 108 that produces the energy is disposed between the outer portion 302 and the inner portion 304. Exemplary rays 306 of thermal energy emitted by the heating elements are shown and represent radiant heat such as infrared or other thermal radiation and/or any other type of emitted energy.

Except where noted, the inner portion 304 may also be substantially similar to that described in FIG. 3 and may have a substantially cylindrical body 308 extending from an upper flange 310. The substantially cylindrical body 308, which may be made of any suitable material such as silver, gold, and/or copper, is configured to reflect the thermal energy from the heating elements 108. The inner portion 304 includes a textured region 312 configured so that reflected thermal energy is directed towards the substrate 102 and, in particular, towards a circumferential region of the substrate 102. To achieve this, the textured region 312 includes a roughened portion 602 configured to control the reflected energy. However, in contrast to the topography of the circumferential ridges 314, the roughened portion 602 of the textured region 312 has an irregular surface with peaks and valleys with random or semi-random amplitude and/or frequency. Alternatively, the roughened portion 602 of the textured region 312 may be designed to have a surface with peaks and valleys with orderly, random, or semi-random amplitude and/or frequency so that reflected thermal energy is directed towards the substrate 102 and, in particular, towards a circumferential region of the substrate 102.

In some embodiments, the roughened portion 602 includes a surface pattern having irregular dot peaks 604 designed such that the rays 306 of thermal energy are directed toward the substrate 102. The irregular dot peaks of the surface pattern in the roughened portion have peak height, dot size, dot shape, dot density, dot distribution or a combination thereof varying from peak to peak irregularly. In some examples, the irregular dot peaks have a peak height varying from peak to peak in irregular distribution, tuned to effectively direct the rays 306 of thermal energy toward the substrate 102. In some examples, the irregular dot peaks have a dot size varying from peak to peak in irregular distribution, tuned to effectively direct the rays 306 of thermal energy toward the substrate 102. In some examples, the irregular dot peaks have an irregular peak location distribution tuned to effectively direct the rays 306 of thermal energy toward the substrate 102. In some examples, the irregular dot peaks have a dot shape (in a top view) varying from peak to peak (such as varying from a round shape to a square shape, a polygon or other shape) and tuned to effectively direct the rays 306 of thermal energy toward the substrate 102. In furtherance of the examples, the dot shape is asymmetric, wherein the upper half and the lower half of a dot peak are different from each other, such as one dot peak 604 illustrated in the bottom right corner of FIG. 6. In some embodiments, the irregular dot peaks have an irregular three-dimensional (3D) profile varying from peak to peak and tuned to effectively direct the rays 306 of thermal energy toward the substrate 102.

The roughened portion 602 may have any suitable degree of roughness and may be substantially rougher than the remainder of the cylindrical body 308. The roughness may be uniform throughout the roughened portion 602 or may be graded. In some embodiments, the roughened portion 602 has a greater degree of roughness near the top of the top reflector 600 than near the bottom of the top reflector 600, although this is merely exemplary and in further embodiments, the opposite is true (i.e., the roughened portion 602 is less rough near the top of the top reflector 600 than near the bottom of the top reflector 600).

The roughened portion 602 may be formed by any suitable process or processes. In some examples, the roughened portion 602 is formed by mechanical means such as abrading and/or thermal deformation, while in some examples, the roughened portion 602 is formed by chemical means such as chemical etching. In further examples, the roughened portion 602 is formed by a combination of both mechanical and chemical means.

Figure 7:
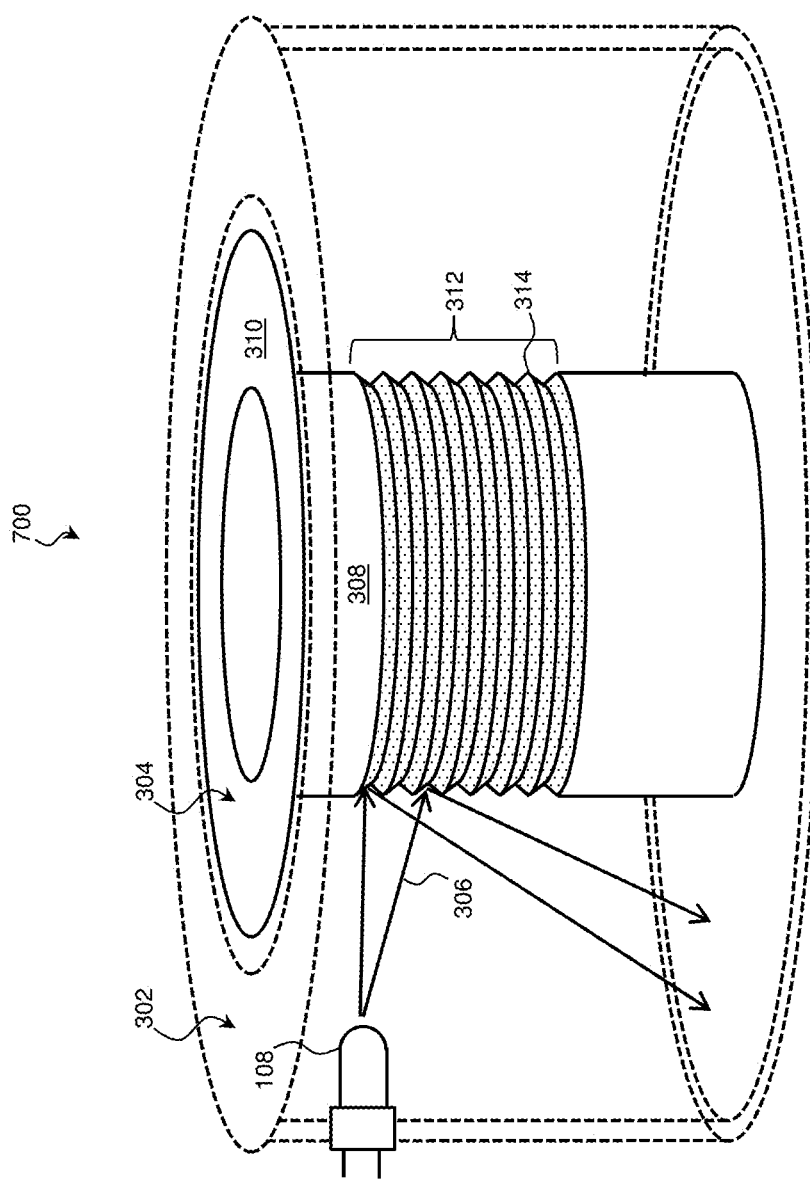
FIG. 7 is a perspective view of a top reflector according to some embodiments of the present disclosure.

Of course, ridges and surface roughening are not mutually exclusive. In some embodiments, both techniques are used to control where reflected energy falls on the substrate 102. FIG. 7 is a perspective view of a top reflector 700 according to some embodiments of the present disclosure. The top reflector 700 is suitable for use as the top reflector 110 of the fabrication system 100 of FIG. 1 and/or any other suitable fabrication tool. For clarity, an outer portion 302 of the reflector 700 is represented as transparent to better illustrate an inner portion 304. The outer portion 302 may be substantially similar to that described in FIG. 3 and may be structured so that thermal energy from heating elements 108 is emitted between the outer portion 302 and the inner portion 304. In some such embodiments, the heating elements 108 extend through holes in the outer portion 302 so that a portion of each heating element 108 that produces the energy is disposed between the outer portion 302 and the inner portion 304. Exemplary rays 306 of thermal energy emitted by the heating elements are shown and represent radiant heat such as infrared or other thermal radiation and/or any other type of emitted energy.

Except where noted, the inner portion 304 may also be substantially similar to that described in FIG. 3 and may have a substantially cylindrical body 308 extending from an upper flange 310. The substantially cylindrical body 308, which may be made of any suitable material such as silver, gold, and/or copper, is configured to reflect the thermal energy from the heating elements 108. The inner portion 304 includes a textured region 312 configured so that reflected thermal energy is directed towards the substrate 102 and, in particular, towards a circumferential region of the substrate 102. The textured region 312 includes circumferential ridges 314 substantially as described in FIGS. 3-5 with a roughened texture substantially similar to the roughened portion 602 of FIG. 6. Together, the ridges and the roughened texture are configured to direct the emitted energy to specific locations on the substrate 102 (e.g., a circumferential region near the circumferential perimeter of the substrate 102).

Figure 8:
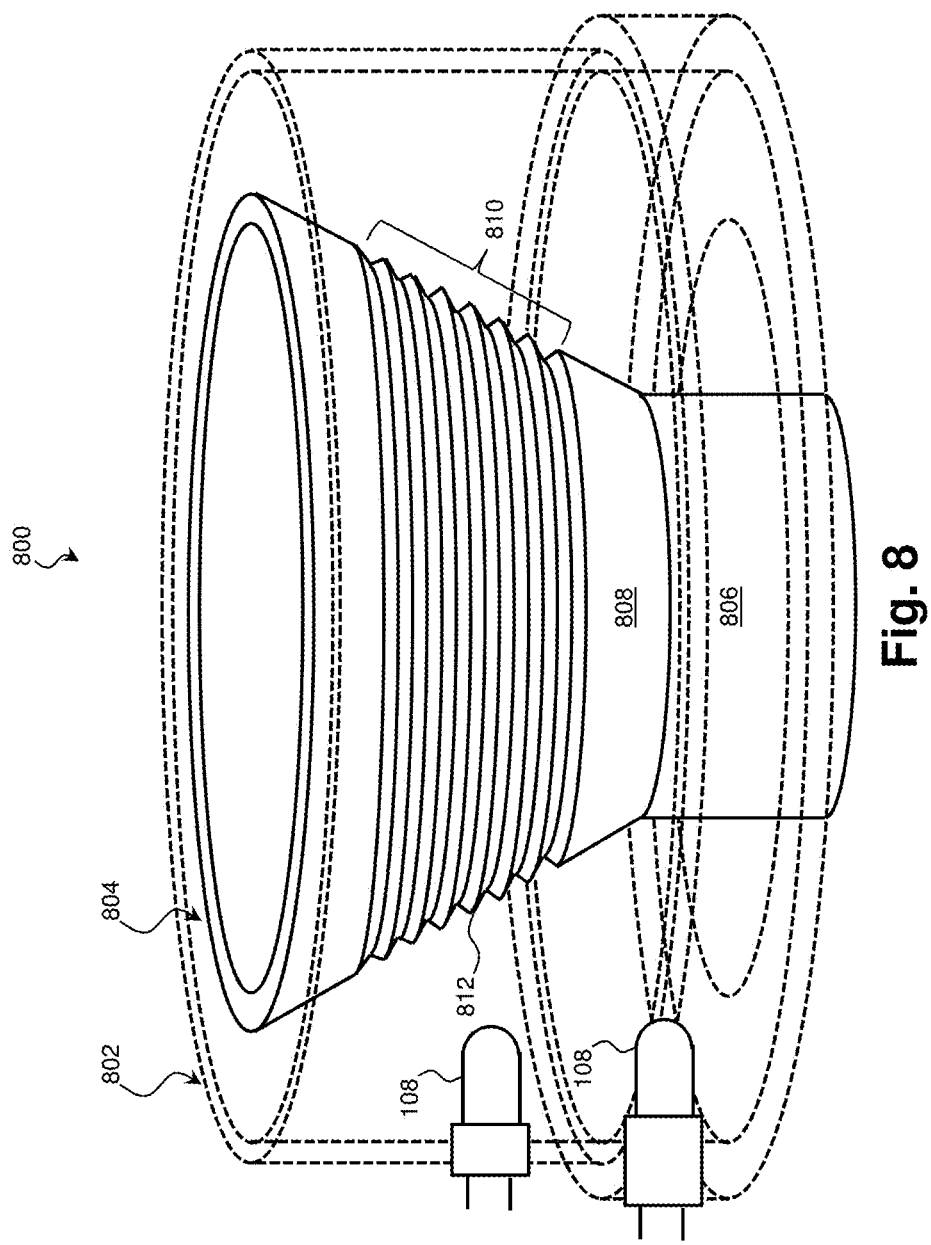
FIG. 8 is a perspective view of a bottom reflector according to some embodiments of the present disclosure.

As with the top reflector, the bottom reflector 112 may include a textured region to control where reflected thermal energy falls on the substrate 102. FIG. 8 is a perspective view of a bottom reflector 800 according to some embodiments of the present disclosure. The bottom reflector 800 is suitable for use as the bottom reflector 112 of the fabrication system 100 of FIG. 1 and/or any other suitable fabrication tool. For clarity, an outer portion 802 of the bottom reflector 800 is represented as transparent to better illustrate an inner portion 804. In some embodiments, the bottom reflector 800 is structured so that thermal energy from heating elements 108 is emitted between the outer portion 802 and the inner portion 804. In some such embodiments, the heating elements 108 extend through holes in the outer portion 802 so that a portion of each heating element 108 that produces the energy is disposed between the outer portion 802 and the inner portion 804.

In the present embodiment, the inner portion 804 of the bottom reflector 800 has a substantially cylindrical body 806 and a substantially frustoconical segment 808 that flares outward extending from the substantially cylindrical body 806. The body 806 and the frustoconical segment 808, which may be made of any suitable material such as silver, gold, and/or copper, may each be configured to reflect the thermal energy from the heating elements 108. While the body 806 may be textured, in the illustrated embodiment, it is the frustoconical segment 808 that contains a textured region 810. The texture of the textured region 810 may be configured so that reflected thermal energy is directed towards the substrate 102 from the bottom and, in particular, towards the circumferential region of the substrate 102. Compared to a smooth configuration, the bottom reflector 800 with the textured region 810 may reflect more thermal energy towards the substrate 102 and may produce more uniform substrate heating.

The texture of the textured region 810 may include a series of circumferential ridges 812 that extend any suitable depth into and/or out of the outermost surface of the inner portion 804. The ridges 812 are enlarged to provide clarity, and in various exemplary embodiments, the ridges 812 have a peak-to-trough height of between about 0.1 mm to about 2 mm. The particular height may be selected to control where the reflected thermal energy is received on the substrate 102. The amount of reflected thermal energy and where it falls on the substrate 102 may also be controlled by the amount of the frustoconical segment 808 that is textured to produce the textured region 810 and where the textured region 810 is located. For example, in some embodiments, the frustoconical segment 808 includes an untextured portion between the substantially cylindrical body 806 and the textured region 810, while in other embodiments, the textured region 810 extends completely to the cylindrical body 806.

The circumferential ridges 812 may be formed by any suitable process or processes. In some examples, the ridges 812 are formed by mechanical means such as cutting or forming (e.g., bending, tucking, stretching, etc.), which may be followed by polishing. In some examples, the ridges 812 are formed by chemical means such as chemical etching, which may be performed as part of a polishing process. In further examples, the ridges 812 are formed by a combination of both mechanical and chemical means.

Figure 9:
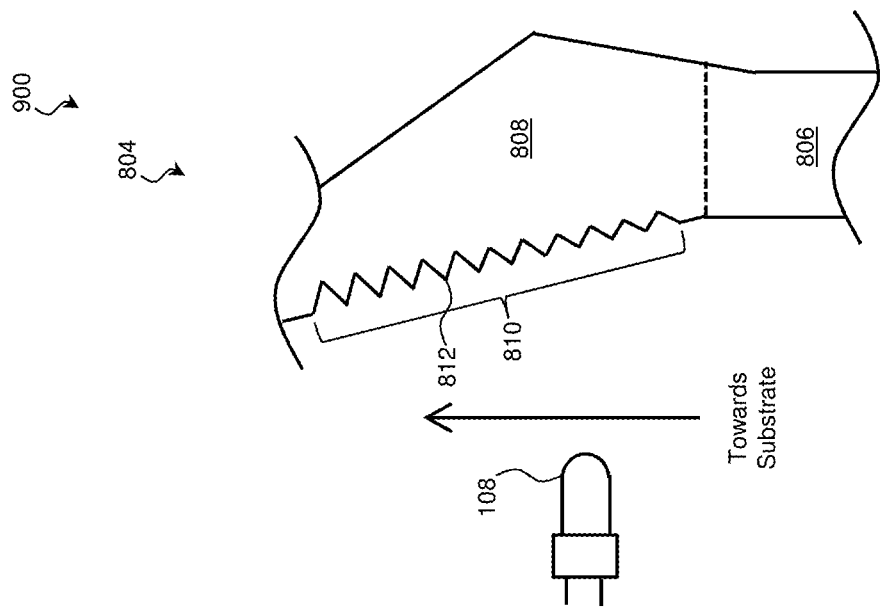
FIG. 9 is a cross-sectional view of a portion of a bottom reflector having circumferential ridges of varying height according to some embodiments of the present disclosure.

In some embodiments, the circumferential ridges 812 vary along the textured region 810. For example, FIG. 9 is a cross-sectional view of a portion of a bottom reflector 900 having circumferential ridges 812 of varying height according to some embodiments of the present disclosure. The bottom reflector 900 may be substantially similar to the bottom reflector 800 of FIG. 8 and is suitable for use as the bottom reflector 112 of the fabrication system 100 of FIG. 1 and/or any other suitable fabrication tool. An outer portion of the reflector 800 is omitted to better illustrate an inner portion 804 but may be substantially similar to the outer portion 802 of FIG. 8.

As can be seen, the peak-to-trough height of the ridges 812 varies along the textured region 810. In the illustrated embodiment, ridges 812 near the top of the bottom reflector 900 have a greater peak-to-trough height than ridges 812 near the bottom of the bottom reflector 900, although this is merely exemplary, and in further embodiments, the opposite is true (i.e., ridges 812 near the bottom of the bottom reflector 900 have a greater peak-to-trough height than ridges 812 near the top of the bottom reflector 900).

Figure 10:
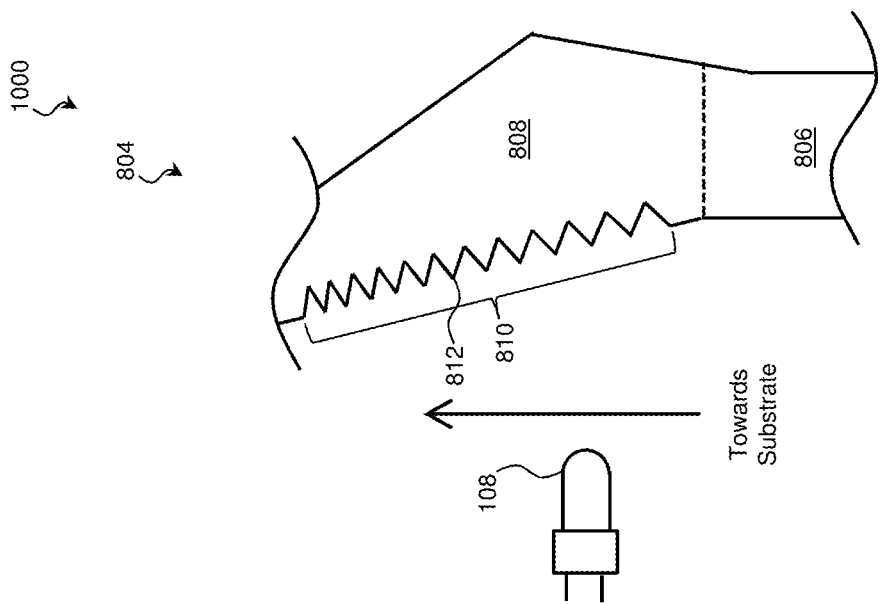
FIG. 10 is a cross-sectional view of a portion of a bottom reflector having circumferential ridges of varying width according to some embodiments of the present disclosure.

FIG. 10 is a cross-sectional view of a portion of a bottom reflector 1000 having circumferential ridges 812 of varying width according to some embodiments of the present disclosure. The bottom reflector 1000 may be substantially similar to the bottom reflectors 800 and 900 of FIGS. 8 and 9, respectively, and is suitable for use as the bottom reflector 112 of the fabrication system 100 of FIG. 1 and/or any other suitable fabrication tool. An outer portion of the reflector 800 is omitted to better illustrate an inner portion 804 but may be substantially similar to the outer portion 802 of FIG. 8.

As can be seen, the trough-to-trough width of the ridges 812 varies along the textured region 810. In the illustrated embodiment, circumferential ridges 812 near the top of the bottom reflector 1000 have a narrower width than ridges 812 near the bottom of the bottom reflector 1000, although this is merely exemplary, and in further embodiments, the opposite is true (i.e., ridges 812 near the bottom of the bottom reflector 1000 have a narrower width than ridges 812 near the top of the bottom reflector 1000).

Of course, it is understood that features may be combined from any of the exemplary bottom reflectors 800, 900, and 1000, and no particular feature is required for any particular embodiment.

Figure 11:
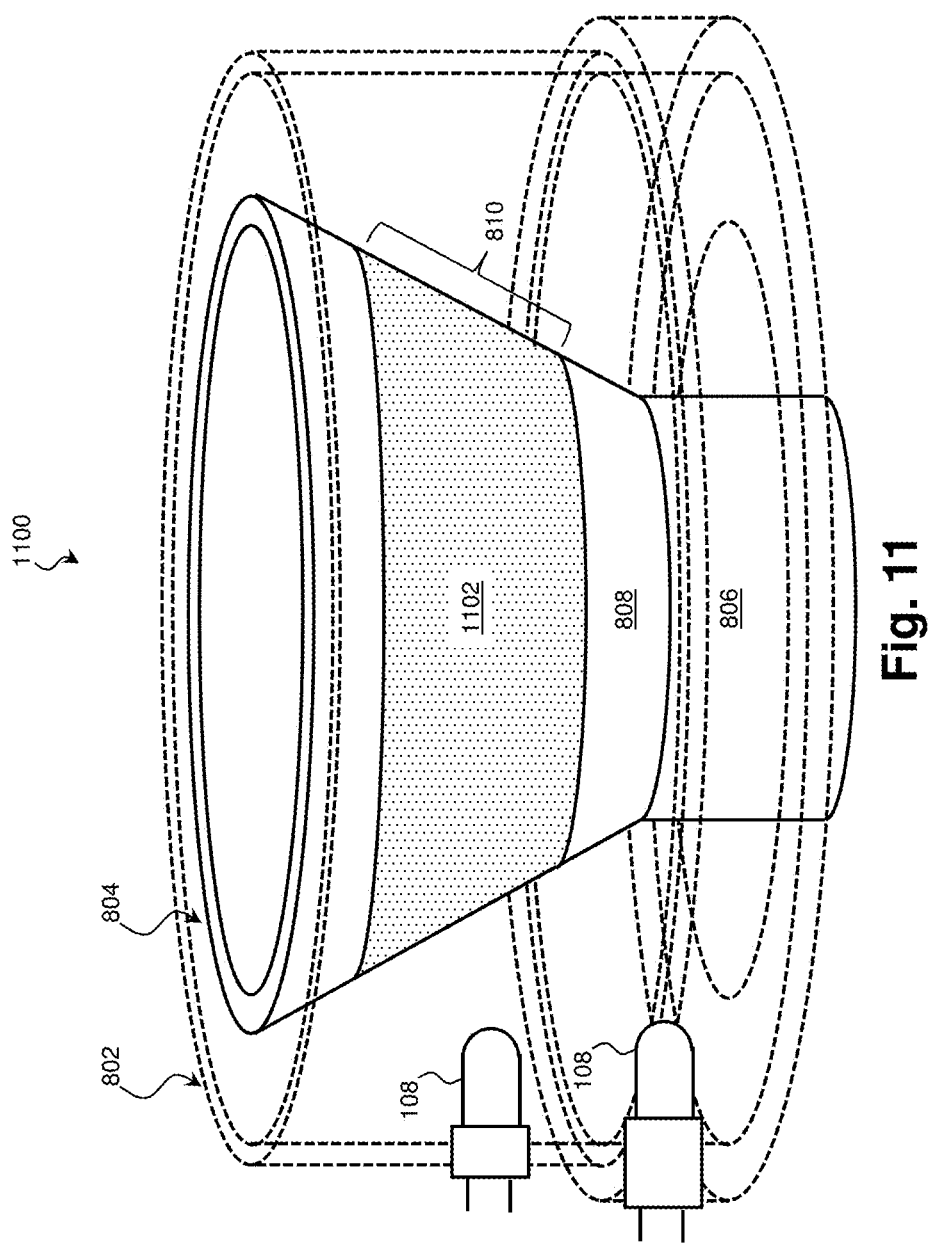
FIG. 11 is a perspective view of a bottom reflector according to some embodiments of the present disclosure.

Additionally or in the alternative, some or all of the textured region 810 may have a roughened texture configured to control reflected thermal energy. FIG. 11 is a perspective view of a bottom reflector 1100 according to some embodiments of the present disclosure. The bottom reflector 1100 is suitable for use as the bottom reflector 112 of the fabrication system 100 of FIG. 1 and/or any other suitable fabrication tool. For clarity, an outer portion 802 of the reflector 1100 is represented as transparent to better illustrate an inner portion 804. The outer portion 802 may be substantially similar to that described in FIG. 8 and may be structured so that thermal energy from heating elements 108 is emitted between the outer portion 802 and the inner portion 804. In some such embodiments, the heating elements 108 extend through holes in the outer portion 802 so that a portion of each heating element 108 that produces the energy is disposed between the outer portion 802 and the inner portion 804.

Except where noted, the inner portion 804 may also be substantially similar to that described in FIG. 8 and may have a substantially cylindrical body 806 and a substantially frustoconical segment 808 that flares outward extending from the substantially cylindrical body 806. The body 806 and the frustoconical segment 808, which may be made of any suitable material such as silver, gold, and/or copper, may each be configured to reflect the thermal energy from the heating elements 108. While the body 806 may be textured, in the illustrated embodiment, it is the frustoconical segment 808 that contains a textured region 810. The textured region 810 may include a roughened portion 1102 configured to control the reflected energy. However, in contrast to the topography of the circumferential ridges 812, the roughened portion 1102 of the textured region 810 has an irregular surface with peaks and valleys with random or semi-random amplitude and/or frequency.

The roughened portion 1102 may have any suitable degree of roughness and may be substantially rougher than the remainder of the frustoconical segment 808 and/or cylindrical body 806. The roughness may be uniform throughout the roughened portion 1102 or may be graded. In some embodiments, the roughened portion 1102 has a greater degree of roughness near the top of the bottom reflector 1100 than near the bottom of the bottom reflector 1100, although this is merely exemplary and in further embodiments, the opposite is true (i.e., the roughened portion 1102 is less rough near the top of the bottom reflector 1100 than near the bottom of the bottom reflector 1100).

The roughened portion 1102 may be formed by any suitable process or processes. In some examples, the roughened portion 1102 is formed by mechanical means such as abrading and/or thermal deformation, while in some examples, the roughened portion 1102 is formed by chemical means such as chemical etching. In further examples, the roughened portion 1102 is formed by a combination of both mechanical and chemical means.

Figure 12:
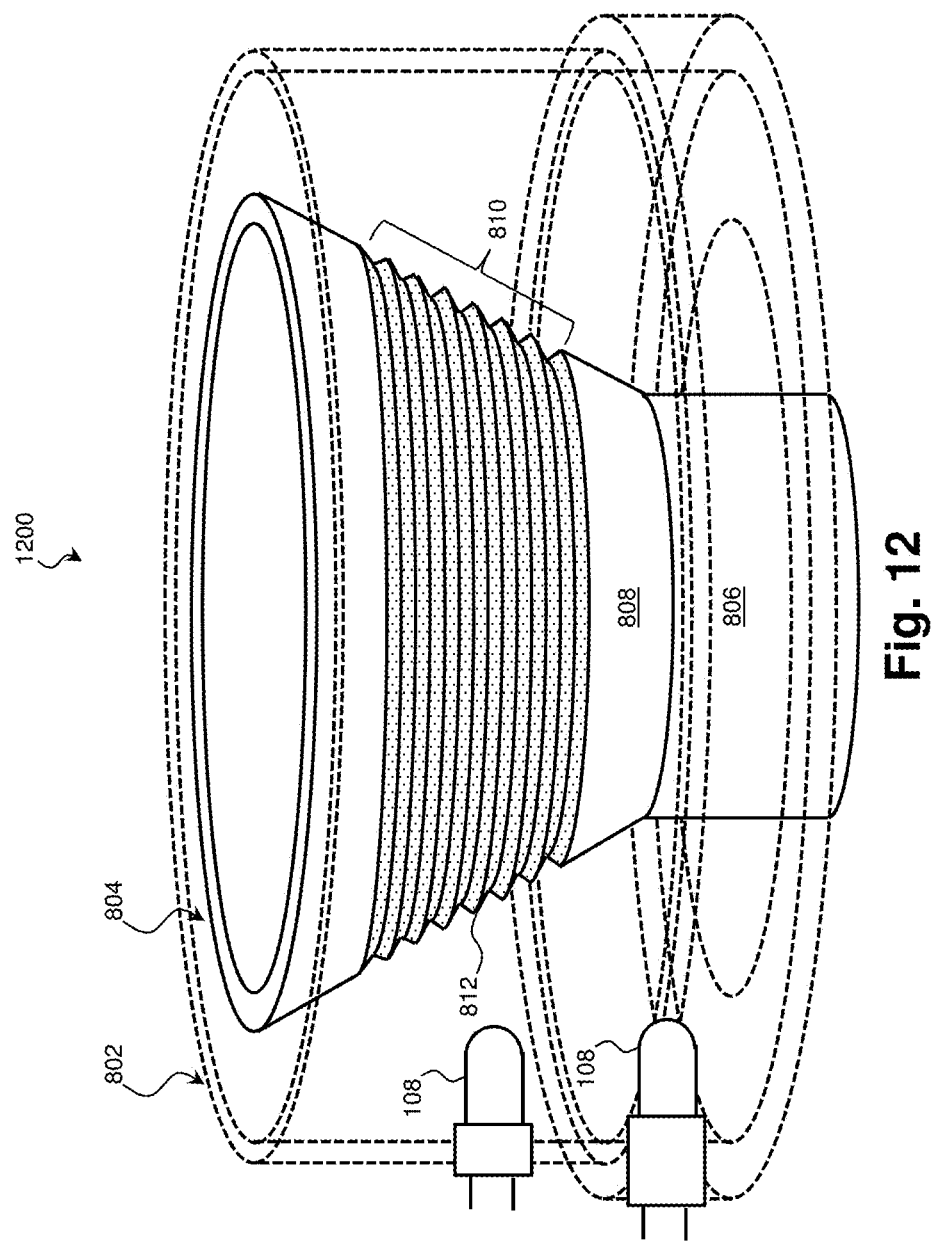
FIG. 12 is a perspective view of a bottom reflector according to some embodiments of the present disclosure.

Ridges and surface roughening are not mutually exclusive. In some embodiments, both techniques are used to control where reflected energy falls on the substrate 102. FIG. 12 is a perspective view of a bottom reflector 1200 according to some embodiments of the present disclosure. The bottom reflector 1200 is suitable for use as the bottom reflector 112 of the fabrication system 100 of FIG. 1 and/or any other suitable fabrication tool. For clarity, an outer portion 802 of the reflector 1200 is represented as transparent to better illustrate an inner portion 804. The outer portion 802 may be substantially similar to that described in FIG. 8 and may be structured so that thermal energy from heating elements 108 is emitted between the outer portion 802 and the inner portion 804. In some such embodiments, the heating elements 108 extend through holes in the outer portion 802 so that a portion of each heating element 108 that produces the energy is disposed between the outer portion 802 and the inner portion 804.

Except where noted, the inner portion 804 may also be substantially similar to that described in FIG. 8 and may have a substantially cylindrical body 806 and a substantially frustoconical segment 808 that flares outward extending from the substantially cylindrical body 806. The body 806 and the frustoconical segment 808, which may be made of any suitable material such as silver, gold, and/or copper, may each be configured to reflect the thermal energy from the heating elements 108. The inner portion 804 includes a textured region 810 configured so that reflected thermal energy is directed towards the substrate 102 and, in particular, towards a circumferential region of the substrate 102. The textured region 810 includes circumferential ridges 812 substantially as described in FIGS. 8-10 with a roughened texture substantially similar to the roughened portion 1102 of FIG. 11. Together, the ridges and the roughened texture are configured to direct the emitted energy to specific locations on the substrate 102 (e.g., a circumferential region near the circumferential perimeter of the substrate 102).

The preceding disclosure provides a number of exemplary embodiments and a number of representative advantages. For brevity, only a limited number of combinations of relevant features have been described. However, it is understood that features of any example may be combined with features of any other example. Furthermore, it is understood that these advantages are nonlimiting and no particular advantage is characteristic of or required for any particular embodiment.

Thus, the present disclosure provides a system for thermal treatment of a substrate that provides more uniform heating of the substrate undergoing a fabrication process such as epitaxy. In some embodiments, the system comprises a heating element, a substrate-retaining element operable to retain a substrate, and a reflective structure disposed below the substrate-retaining element. The reflective structure is operable to direct thermal energy of the heating element towards the substrate retained in the substrate-retaining element and has a textured portion where a texture of the textured portion is configured to direct the thermal energy towards the retained substrate. In some such embodiments, the reflective structure includes a frustoconical segment, and wherein the textured portion is disposed on the frustoconical segment of the reflective structure. In some such embodiments, the texture of the textured portion is configured to direct a portion of thermal energy towards a circumferential region of the substrate.

In further embodiments, the thermal reflector comprises a cylindrical body and a frustoconical segment extending from the cylindrical body. The frustoconical segment includes a textured region configured to reflect thermal energy towards a circumferential region of a substrate. In some such embodiments, the textured region includes an irregularly textured surface configured to reflect the thermal energy towards the circumferential region of the substrate. In some such embodiments, the textured region includes a plurality of circumferential ridges configured to reflect the thermal energy towards the circumferential region of the substrate.

In yet further embodiments, the fabrication system comprises a plurality of heating elements disposed around a reflector and a substrate-retaining element operable to retain a substrate. The reflector includes a frustoconical portion having a textured surface configured to direct thermal energy of the heating elements towards the substrate retained in the substrate-retaining element. In some such embodiments, the textured surface is irregularly textured with peaks and valley of semi-random amplitude and frequency that are configured to direct the thermal energy of the heating elements towards the substrate retained in the substrate-retaining element. In some such embodiments, the textured surface has a plurality of circumferential ridges configured to direct the thermal energy of the heating elements towards the substrate retained in the substrate-retaining element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system comprising:
a heating element;
a substrate-retaining element operable to retain a substrate; and
a reflective structure operable to direct thermal energy of the heating element towards the substrate retained in the substrate-retaining element,
wherein the reflective structure includes an outer portion and an inner portion,
wherein the heating element extends through a hole of the outer portion so that the thermal energy from the heating element is emitted between the inner and outer portions,
wherein the inner portion has a textured portion,
wherein a texture of the texture portion includes a plurality of circumferential ridge structures,
wherein a trough-to-trough width of the plurality of circumferential ridge structures varies to have a grading textured pattern that has a greater trough-to-trough width near a top of the inner portion than near a bottom of the inner portion, and
wherein the grading textured pattern is structured to reflect the thermal energy non-uniformly so that more thermal energy is reflected towards a circumferential region of the substrate than a middle region of the substrate.

2. The system of claim 1, wherein the reflective structure includes a frustoconical segment, and wherein the textured portion is disposed on the frustoconical segment of the reflective structure.

3. The system of claim 1, wherein ridges near the top of the reflective structure have a greater trough-to-trough width than ridges near the bottom of the reflective structure and the texture of the textured portion is configured to direct a portion of thermal energy towards a circumferential region of the substrate.

4. The system of claim 1, wherein the texture includes a roughened irregular surface configured to direct the thermal energy towards the substrate.

5. The system of claim 1, wherein ridges near the bottom of the reflective structure have a greater trough-to-trough width than ridges near the top of the reflective structure.

6. The system of claim 1, wherein ridges near the top of the reflective structure have a greater peak-to-trough height than ridges near the bottom of the reflective structure.

7. The system of claim 1, wherein ridges near the bottom of the reflective structure have a greater peak-to-trough height than ridges near the top of the reflective structure.

8. The system of claim 1, wherein the plurality of circumferential ridge structures has a peak-to-trough height of between about 0.1 mm and about 2 mm.

9. The system of claim 4, wherein the roughened irregular surface has a greater degree of roughness near the top of the reflective structure than near the bottom of the reflective structure.

10. The system of claim 4, wherein the roughened irregular surface has a greater degree of roughness near the bottom of the reflective structure than near the top of the reflective structure.

11. A system comprising:
a heating element;
a substrate-retaining element operable to retain a substrate; and
a reflective structure operable to direct thermal energy of the heating element towards the substrate retained in the substrate-retaining element,
wherein the reflective structure includes an outer portion and an inner portion having an upper flange extending from the outer portion, wherein the heating element extending through a hole of the outer portion so that the heating element produces the thermal energy between the inner portion and the outer portion,
wherein the inner portion includes a cylindrical body and a frustoconical segment,
wherein the frustoconical segment includes a textured region disposed on an outmost surface of the frustoconical segment and configured to reflect thermal energy towards a circumferential region of the substrate, and
wherein the frustoconical segment includes an untextured region interposed between the cylindrical body and the textured region,
wherein the textured region includes a plurality of circumferential ridges configured to reflect the thermal energy towards the circumferential region of the substrate and ridges of the plurality of circumferential ridges have varying peak-to-trough heights along the textured region, and wherein ridges near bottom of the reflective structure have a greater peak-to-trough height than ridges near top of the reflective structure, and
wherein the ridges of the plurality of circumferential ridges have varying trough-to-trough widths along the textured region, and wherein ridges near the bottom of the reflective structure have a greater trough-to-trough width than ridges near the top of the reflective structure.

12. The system of claim 11, wherein
the textured region includes an irregularly textured surface that has a graded degree of roughness; and
the irregularly textured surface has a greater degree of roughness near the bottom of the frustoconical segment than near the top of the frustoconical segment.

13. The system of claim 12, wherein the untextured region is amounted to control an amount radiation reflected towards the substrate and a location that the radiation falls on the substrate.

14. The system of claim 13, wherein the irregularly textured surface has a greater degree of roughness from near the top of the reflective structure than near the bottom of the reflective structure.

15. A system comprising:
a substrate-retaining element operable to retain a substrate;
a reflective structure including a top reflector configured overlying the substrate retained on the substrate-retaining element and a bottom reflector configured underlying the substrate retained on the substrate-retaining element, wherein the top reflector includes a top outer portion and a top inner portion surrounded by the top outer portion, wherein the bottom reflector includes a bottom outer portion and a bottom inner portion surrounded by the bottom outer portion; and
heating elements including a first heating element and a second heating element, wherein the first heating element extends through a hole of the top outer portion so that the first heating element produces a first radiation disposed between the top inner portion and the top outer portion, wherein the second heating element extends through a hole of the bottom outer portion so that the second heating element produces a second radiation disposed between the bottom inner portion and the bottom outer portion, wherein the top reflector and the bottom reflector are structured to direct the first radiation and the second radiation toward the substrate,
wherein the top reflector includes a first cylindrical body and is structured to reflect more thermal energy from the first radiation towards a circumferential region of the substrate,
wherein the bottom reflector includes a second cylindrical body and a frustoconical segment extending from the second cylindrical body, the bottom reflector being structured to produce more uniform heating than the top reflector to the substrate,
wherein the top inner portion includes a first textured region disposed on the first cylindrical body structured to direct the first radiation towards the substrate,
wherein the bottom inner portion includes a second textured region disposed on the frustoconical segment,
wherein the frustoconical segment includes a untextured region interposed between the second cylindrical body and the second textured region, wherein the untextured region is sized to control an amount of the second radiation reflected towards the substrate and a location that the second radiation falls on the substrate,
wherein a texture of the first textured region includes a plurality of circumferential ridge structures configured to direct a portion of thermal energy towards the circumferential region of the substrate,
wherein a trough-to-trough width of the plurality of circumferential ridge structures varies so that ridges near a top of the top reflector have a greater trough-to-trough width than ridges near a bottom of the top reflector, and
wherein the plurality of circumferential ridge structures includes a roughened texture having irregular dot peaks that have a dot shape varying from a round shape to one of a square shape and a polygon.

* * * * *